(12) United States Patent
Kim et al.

(10) Patent No.: US 7,433,223 B2
(45) Date of Patent: Oct. 7, 2008

(54) MEMORY DEVICES INCLUDING FLOATING BODY TRANSISTOR CAPACITORLESS MEMORY CELLS AND RELATED METHODS

(75) Inventors: Jin-Young Kim, Seoul (KR); Ki-Whan Song, Seoul (KR); Yeong-Taek Lee, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 169 days.

(21) Appl. No.: 11/546,421

(22) Filed: Oct. 12, 2006

(65) Prior Publication Data

US 2007/0159903 A1    Jul. 12, 2007

(51) Int. Cl.
*G11C 11/24* (2006.01)

(52) U.S. Cl. ............................ 365/149; 365/190

(58) Field of Classification Search ............... 365/149, 365/190, 189.07
See application file for complete search history.

(56) References Cited

U.S. PATENT DOCUMENTS

| 6,567,330 | B2 | 5/2003 | Fujita et al. | |
|---|---|---|---|---|
| 7,177,175 | B2* | 2/2007 | Fazan et al. | 365/149 |
| 7,257,015 | B2* | 8/2007 | Ohsawa | 365/150 |
| 2005/0041457 | A1* | 2/2005 | Forbes | 365/149 |
| 2006/0126374 | A1* | 6/2006 | Waller et al. | 365/149 |

* cited by examiner

*Primary Examiner*—Vu A Le
(74) *Attorney, Agent, or Firm*—Volentine & Whitt, PLLC

(57) ABSTRACT

In one aspect, a semiconductor memory device is provided which includes complementary first and second bit lines, a unit memory cell including complementary first and second floating body transistor capacitorless memory cells respectively coupled to the complementary first and second bit lines, and a voltage sense amplifier coupled between the complementary first and second bit lines which amplifies a voltage differential between the complementary first and second bit lines.

35 Claims, 10 Drawing Sheets

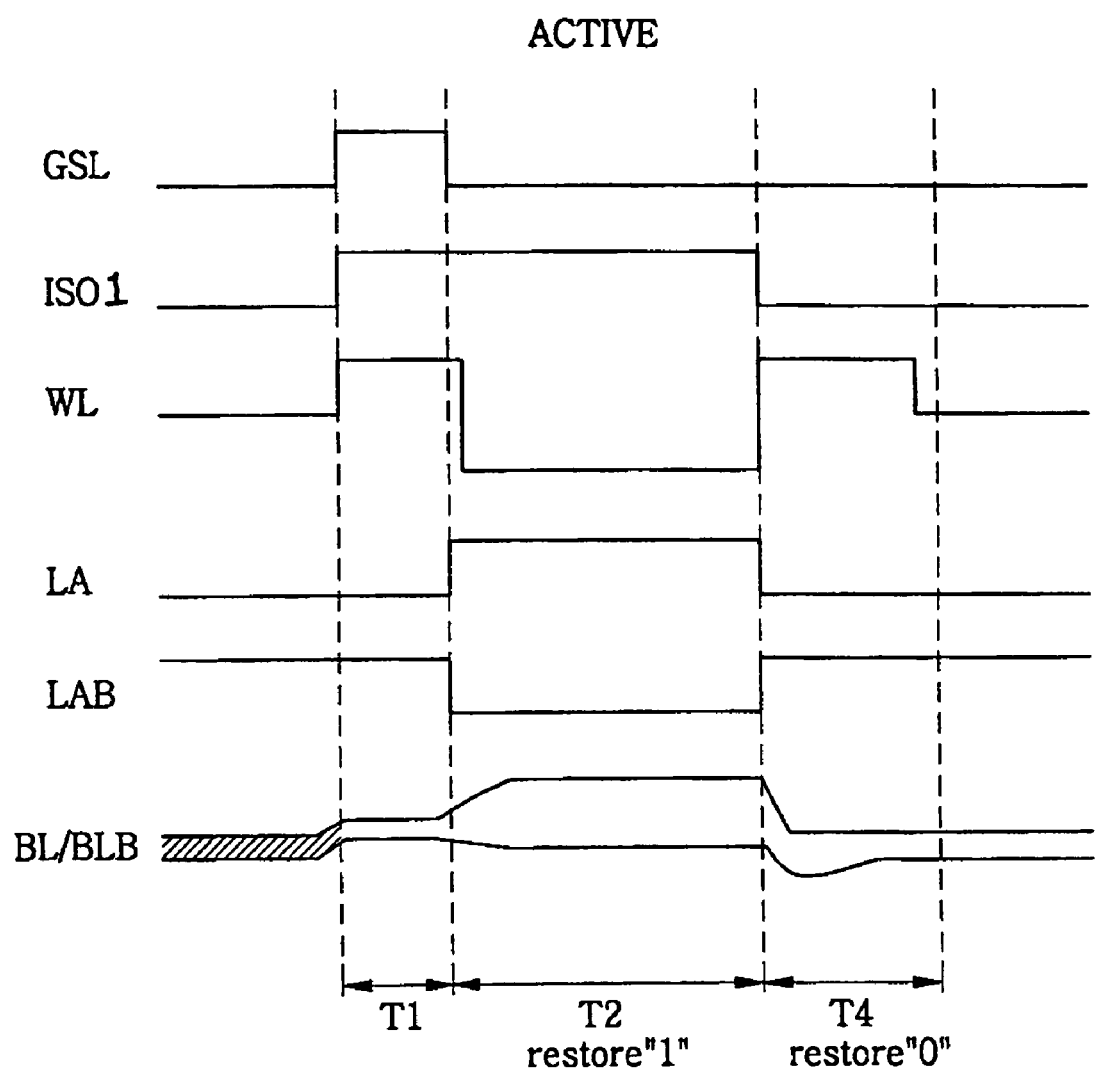

MEMORY DEVICES INCLUDING FLOATING BODY TRANSISTOR CAPACITORLESS MEMORY CELLS AND RELATED METHODS

BACKGROUND OF THE INVENTION

1. Field of the Invention

The present invention generally relates to semiconductor memory devices, and more particularly, the present invention relates to semiconductor memory devices which include floating body transistor capacitorless memory cells and to methods of operating such devices.

A claim of priority is made to Korean Patent Application No. 10-2006-0001989, filed Jan. 6, 2006, the entirety of which is incorporated herein by reference.

2. Description of the Related Art

Typically, the memory cells of dynamic random access memory (DRAM) devices are composed of a capacitor for storing charges and a transistor for accessing the capacitor. A logic value of each memory cell is determined by a voltage of the capacitor. However, in an effort to increase device integration, DRAM memory cells composed of a single transistor have been proposed. These single-transistor type memory cells are referred to herein as "floating body transistor capacitorless memory cells", and in some instances, the short-hand phrase "transistor cell" is utilized.

In a write mode, the threshold voltage of a floating body transistor capacitorless memory cell is varied by altering the channel body potential of the cell, and in a read mode, logic states are discriminated based on an amount of current passing through the cell. This is explained in more detail below with reference to FIG. 1.

FIG. 1 is a cross-sectional schematic view of an example of a floating body transistor capacitorless memory cell. As shown, the floating body transistor capacitorless memory cell of this example includes a silicon (Si) substrate 100 and a buried oxide layer 101. Located over the buried oxide layer 101 is a floating channel body region 102 interposed between source and drain regions 103 and 104. A gate dielectric 105 and gate electrode 106 are aligned over a floating channel body region 102, and insulating layers 107 (e.g., $SiO_2$ layers) are formed to isolate the floating body transistor capacitorless memory cell from other devices on the substrate 100.

Logic "1" and "0" states are dependent upon the threshold voltage Vth of the floating body transistor capacitorless memory cell, and examples of write and read voltages applied to the floating body transistor capacitorless memory cell are illustrated below in Table 1:

TABLE 1

| | Threshold (Vth) | Source (Vs) | Gate (Vg) | Drain (Vd) |
|---|---|---|---|---|
| Write "1" | Low | 0 V | 1.5 V | 1.5 V |
| Write "0" | High | 0 V | 1.5 V | −1.5 V |
| Read | n/a | 0 V | 1.5 V | 0.2 V |

In a write data "1" operation, a voltage bias condition is set in which Vgs>Vth and Vgd<Vth. This causes the transistor cell to operate in a saturation region. In this state, impact ionization occurs at the junction between the drain region 104 and the floating channel body region 102. As a result, holes are injected in the floating channel body region 102. This increases the potential of the floating channel body region 102 and reduces the threshold voltage Vth of the floating body transistor capacitorless memory cell.

In a write data "0" operation, the drain voltage Vd is dropped to a negative voltage to create a forward bias condition at the junction between the floating channel body region 102 and the drain region 104. The forward bias causes holes contained in the floating channel body region 102 to migrate into the drain region 104. This reduces the potential of the floating channel body region 102 and increases the threshold voltage Vth.

In a read operation, a voltage bias condition is set such that Vgs>Vth and Vgd>Vth, and such that the transistor cell is operated in its linear region. A drain current is measured and compared to a reference cell current to thereby distinguish whether the floating body transistor capacitorless memory cell is in a high (logic "0") or low (logic "1") voltage threshold Vth state. More particularly, if the measured drain current is less than the reference current, then a logic "0" state is read. If the measured drain current is more than the reference current, then a logic "1" state is read.

Conventionally, the reference cell current is generated using reference (or dummy) transistor cells which are respectively programmed to "0" and "1" states. In addition, a reference voltage generating circuit and other circuits are utilized to generate a reference current which lies between the drain currents of the "0" and "1" reference transistor cells. See, for example, U.S. Pat. No. 6,567,330, issued May 20, 2003, in the name of Fujita et al.

The reading of floating body transistor capacitorless memory cells is prone to a variety of errors. Examples of such errors are described next with reference to FIGS. 2A through 2C.

FIGS. 2A and 2B shows "0" state and "1" state drain current distributions 201 and 202 of a number of floating body transistor capacitorless memory cells, and reference cell current distributions 203 associated with multiple read operations. FIG. 2A illustrates the case where the reference cell current distribution 203 and the "0" state drain current distribution 201 overlap at 210, and FIG. 2B illustrates the case where the reference cell current distribution 203 and the "1" state drain current distribution 202 overlap at 211. In either case, read errors will occur. The overlap conditions 210 and 211 of FIGS. 2A and 2B can result from a number of factors, including process variations, temperature variations, and so on.

FIG. 2C shows the case where the transistor cell "0" state and "1" state drain current distributions 201 and 202 overlap one another at 212. This can result from the volatile nature of floating body transistor capacitorless memory cells. That is, leakage from the floating channel body region can cause the threshold voltages Vth of the cell transistors to drift. It is therefore necessary to periodically refresh floating body transistor capacitorless memory cells much in the same way that conventional capacitor-type DRAM cells are refreshed.

In addition to the propensity for reading errors described above, the conventional floating body transistor capacitorless memory cell DRAM device suffers the drawback of requiring the provision of a reference current generator, reference memory cells and other circuits to generate the reference current. These can prove burdensome when attempting to increase the density of the memory device. Also, additional time is consumed in a refresh operation to refresh the reference memory cells.

SUMMARY OF THE INVENTION

According to an aspect of the present invention, a semiconductor memory device is provided which includes complementary first and second bit lines, a unit memory cell including complementary first and second floating body transistor capacitorless memory cells respectively coupled to the complementary first and second bit lines, and a voltage sense amplifier coupled between the complementary first and second bit lines which amplifies a voltage differential between the complementary first and second bit lines.

According to another aspect of the present invention, a semiconductor memory device is provided which includes a memory cell array which includes a plurality of memory cell blocks and a plurality of voltage sense amplifiers connected to the plurality of memory cell blocks, where each of the memory cell blocks includes complementary first and second bit lines, and a unit memory cell including complementary first and second floating body transistor capacitorless memory cells respectively connected to the complementary first and second bit lines.

According to yet another aspect of the present invention, a method of writing or restoring a threshold voltage of a floating body transistor capacitorless memory cell device is provided which includes capacitively coupling first and second bit lines to cause a negative basis condition which writes or restores a threshold voltage of one of first and second floating body transistor capacitorless memory cells respectively connected to the first and second bit lines.

According to still another aspect of the present invention, a method of operating a semiconductor memory device is provided which includes restoring a low threshold state of a complementary first floating body transistor capacitorless memory cell connected to the first bit line, and restoring a high threshold state of a complementary second floating body transistor capacitorless memory cell connected to the second bit line, where the high threshold state of the complementary second floating body transistor capacitorless memory cell is restored by capacitive coupling between the first and second bit lines which causes a voltage of the second bit line to become negative.

According to yet another aspect of the present invention, a method of operating a semiconductor memory device is provided which includes charging complementary first and second bit lines which are respectively connected to complementary first and second floating body transistor capacitorless memory cells, where a voltage differential between the charged first and second bit lines corresponds to difference in threshold voltages between the first and second floating body transistor capacitorless memory cells, and amplifying the voltage differential between the charged first and second bit lines.

BRIEF DESCRIPTION OF THE DRAWINGS

The above and other aspects and features of the present invention will become readily apparent from the detailed description that follows, with reference to the accompanying drawings, in which:

FIGS. 6A through 6C are timing diagrams for explaining the operation of a floating body transistor capacitorless memory cell device according to another embodiment of the present invention.

DETAILED DESCRIPTION OF EMBODIMENTS

Figure 1:
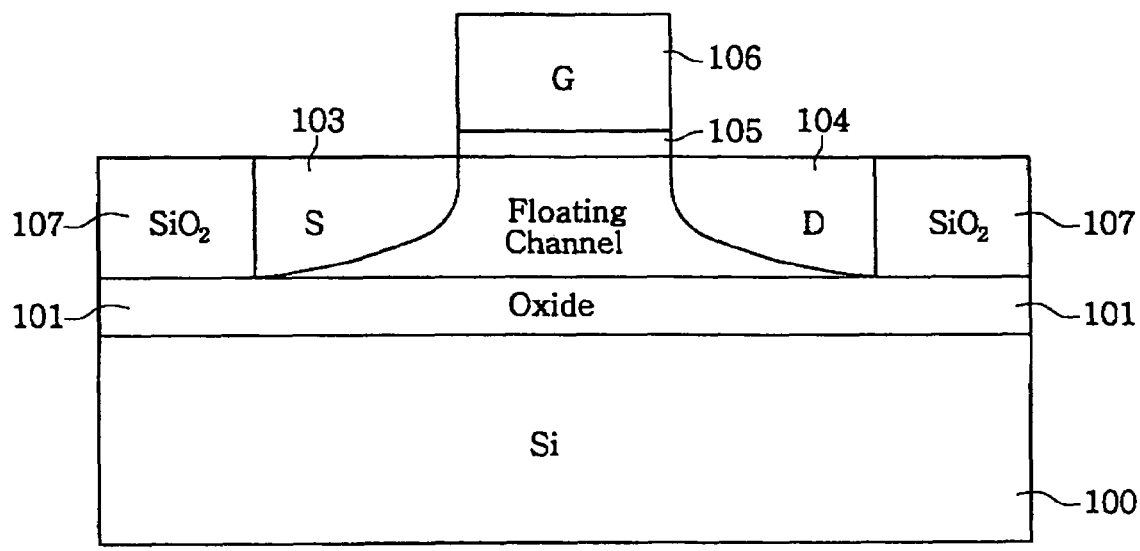
FIG. 1 is cross-sectional view of a conventional floating body transistor capacitorless memory cell.
Figure 2A:
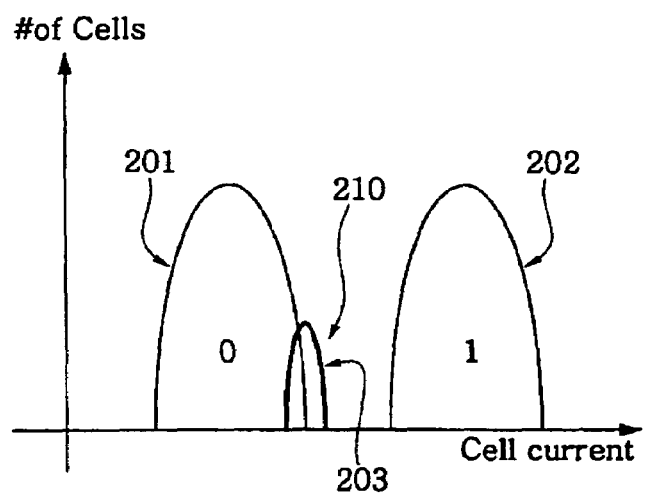
FIGS. 2A through 2C are graphs showing cell current distributions of conventional floating body transistor capacitorless memory cells.
Figure 2B:
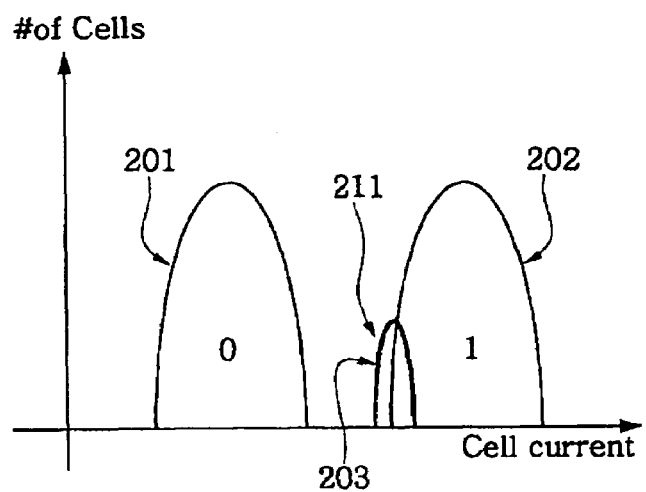
Figure 2C:
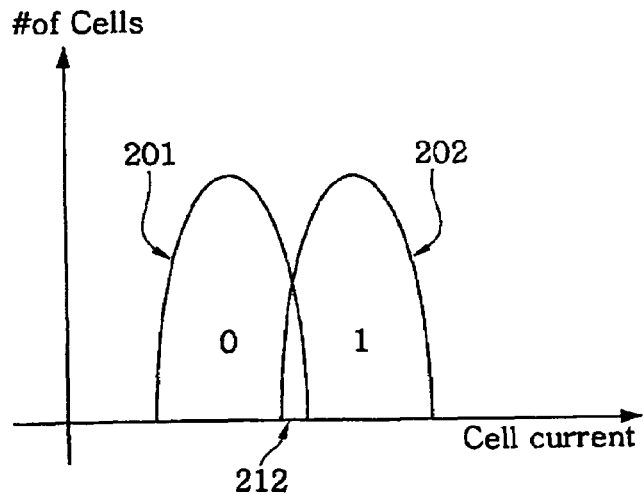

The invention is described more fully hereinafter with reference to the accompanying drawings, in which exemplary embodiments of the present invention are shown. The present invention may, however, be embodied in many different forms and should not be construed as limited to the examples set forth herein. In the drawings, the sizes and relative sizes of layers and regions may be exaggerated and/or simplified for clarity. Also, it will be understood that when an element or layer is referred to as being "on", "connected to" or "coupled to" another element or layer, it can be directly on, connected or coupled to the other element or layer, or intervening elements or layers may be present.

The present invention will now be described by way of preferred, but non-limiting, embodiments of the invention.

Figure 3:
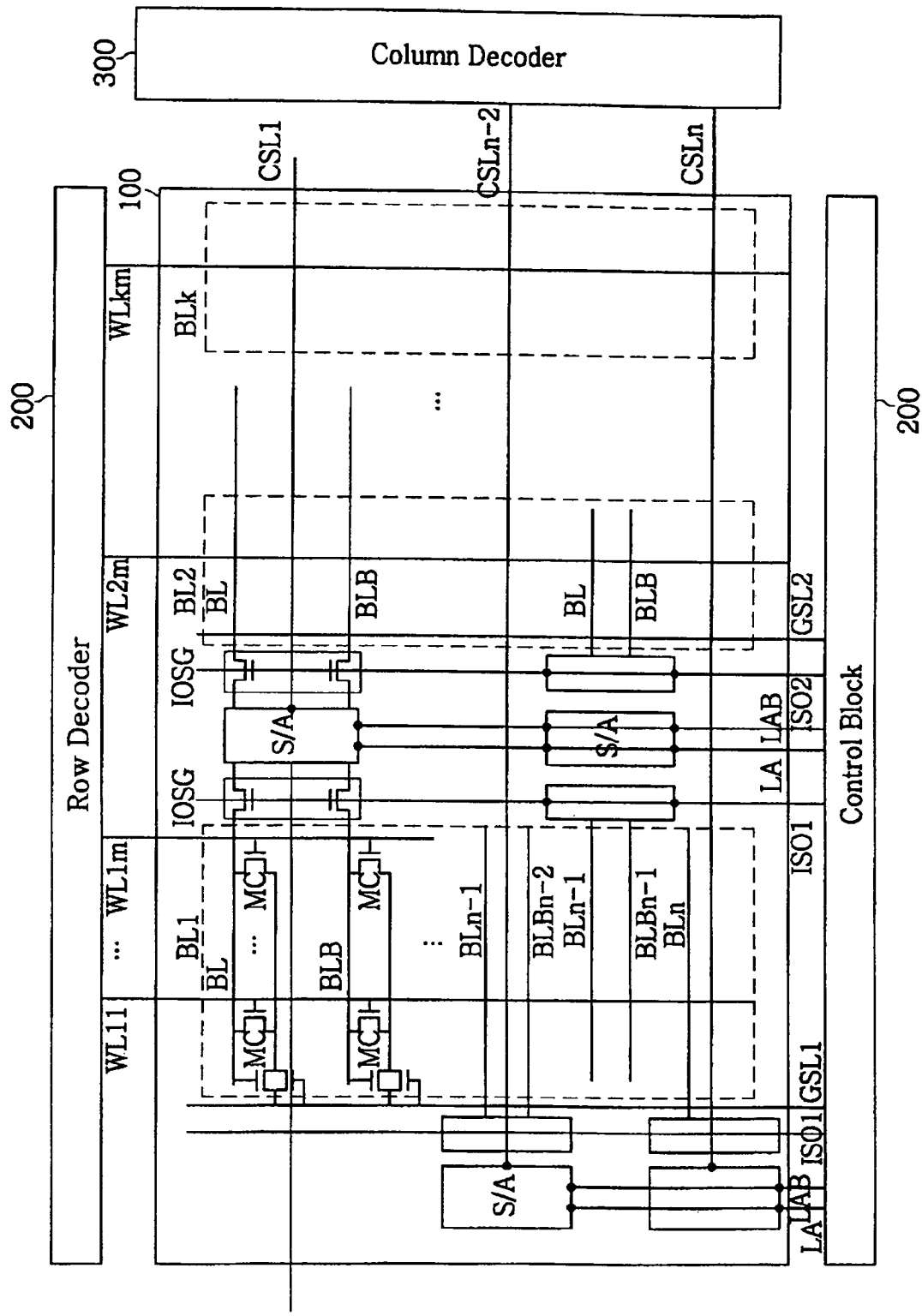
FIG. 3 is a block diagram of a floating body transistor capacitorless memory cell device according to an embodiment of the present invention.

FIG. 3 is a block diagram of floating body transistor capacitorless memory cell device according to an embodiment of the present invention.

The memory cell device of the example of FIG. 3 includes a memory cell array 100, a row decoder 200, a column decoder 300, and a control block 400.

The memory cell array 100 includes a plurality of memory blocks BLK<1:k> as shown in FIG. 3. Each memory block BLK<1:k> includes a plurality of word lines WL<1:m>, a plurality of true bit lines BL<1:n>, and a plurality of complementary bit lines BLB<1:n>. In this example, the bit lines BL<1:n> and complementary bit lines BLB<1:n> are alternately arranged within each memory block BLK<1:k> as shown in FIG. 3.

Each bit line BL and its complementary bit line BLB are collectively referred to herein as a "bit line pair" BL/BLB. Accordingly, in the example of this embodiment, there are "n" bit line pairs BL/BLB<1:n> per memory block BLK.

As will be explained in more detail later (with reference to FIG. 4), a floating body transistor capacitorless memory cell MC is located at each intersection of the word lines WL<1:k><1:m> and bit lines BL<1:n> and BLB<1:n> within each memory block BLK<1:k>. A "unit memory cell" is defined in this embodiment by a first floating body transistor capacitorless memory cell MC connected to a true bit line BL, and a second floating body transistor capacitorless memory cell MC connected to a complementary bit line BLB. The unit memory cell stores a logic value as indicated by complementary threshold voltage states of the first and second floating body transistor capacitorless memory cells. That is, each of the unit memory cells includes complementary first and second floating body transistor capacitor-less memory cells having opposite threshold voltage states. In the example of this embodiment, the floating body transistor capacitorless memory cells are NMOS type transistors.

Since there are "m" word lines WL per memory block, and "n" bit line pairs BL/BLB per memory block BLK, each of the "k" memory blocks BLK of the memory cell array 100 includes "m×n" unit memory cells.

Still referring to FIG. 3, a pair of isolation gates ISOG and a sense amplifier S/A are connected between corresponding bit lines pairs BL/BLB of adjacent memory blocks BLK. In the example of this embodiment, each pair of isolation gates ISOG and sense amplifiers S/A connected between odd-numbered bit line pairs BL/BLB are aligned to the right (relative to the view of FIG. 3) of the odd-numbered memory blocks BLK, and the sets of isolation gates ISOG and sense amplifiers S/A connected between even-numbered bit line pairs BL/BLB are aligned to the right (relative to the view of FIG. 3) of the even-numbered memory blocks BLK.

The word lines WL<1:k><1:m> are connected to the row decoder 200 as shown in FIG. 3. Further, the column decoder 300 generates column select signals CSL<1:n> which are applied to the respective sense amplifiers S/A of the complementary bit line pairs BL/BLB<1:n>. Still further, the control block 400 generates a number of control signals for the isolation gates ISOG and sense amplifiers S/A associated with each memory block BLK. These control signals includes first and second isolation signals ISO1 and ISO2, first and second sense amplifier control signals LA and LAB, and a ground select line signal GSL. Also, although not shown to avoid complexity in the figure, complementary data lines are applied to column select gates (not shown) of the sense amplifiers S/A associated with each memory block BLK.

Figure 4:
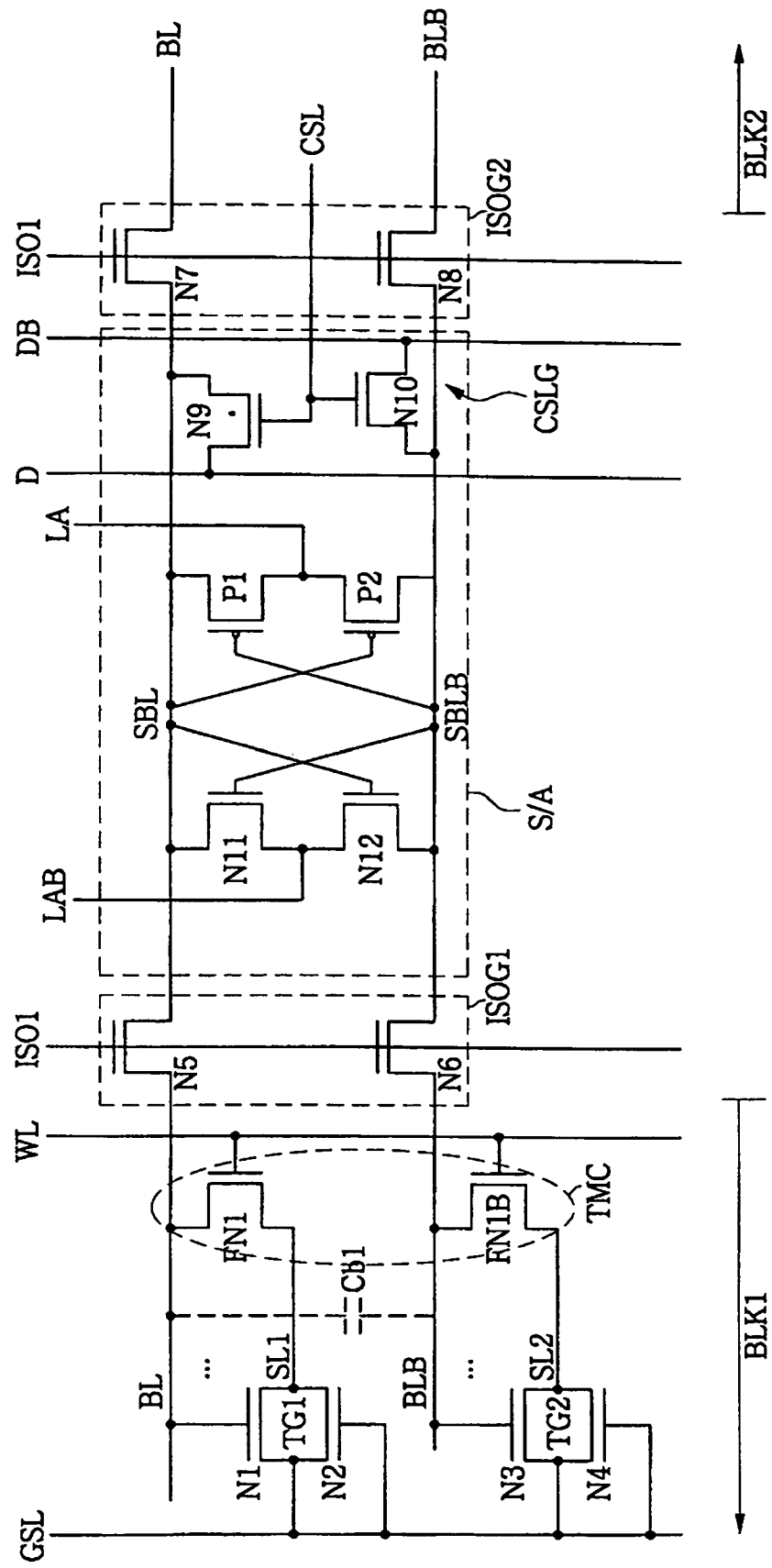
FIG. 4 is circuit diagram illustrating a unit memory cell and sense amplifier according to an embodiment of the present invention.

Reference is now made to FIG. 4 which illustrates an example of the isolation gates IOSG and the sense amplifier S/A connected between bit line pairs BL/BLB of adjacent memory blocks BLK1 and BLK2.

In the first memory block BLK1, a unit memory cell TMC (also referred to here as a twin memory cell) is formed by complementary first and second floating body capacitorless memory cells FN1 and FN1B which are each gated to a word line WL. The first floating body capacitorless memory cell FN1 is connected between true bit line BL and a first select line SL1, and the second floating body capacitorless memory cell FN1B is connected between complementary bit line BLB and a second select line SL2.

A first transmission gate TG1 is connected between the first select line SL1 and a ground select line GSL, and a second transmission gate TG2 is connected between the second select line SL2 and the ground select line GSL. The first transmission gate TG1 includes NMOS transistors N1 and N2 respectively gated to the true bit line BL and the ground select line GSL. Likewise, the second transmission gate TG2 includes NMOS transistors N3 and N4 respectively gated to the complementary bit line BLB and the ground select line GSL.

Illustrated by a dashed-line in FIG. 4 is a parasitic capacitance Cb1 between the true bit line BL and the complementary bit line BLB. As will be explained in more detail later, one or more operational embodiments of the invention utilize this parasitic capacitance Cb1 to restore one or more threshold voltages of the twin memory cell TMC.

The second memory block BLK 2 is similarly configured as the above-described first memory block BLK1.

A first isolation gate ISOG1 includes an NMOS transistor N5 connected between a true sub-bit line SBL and the true bit line BL of the first memory block BLK1, and an NMOS transistor N6 connected between a complementary sub-bit line SBLB and the complementary bit line BLB of the first memory block BLK1. Similarly, a second isolation gate ISOG2 includes an NMOS transistor N7 connected between the true sub-bit line SBL and the true bit line BL of the second memory block BLK2, and an NMOS transistor N8 connected between the complementary sub-bit line SBLB and the complementary bit line BLB of the second memory block BLK2. The NMOS transistors N5 and N6 of the first isolation gate ISOG1 are gated to a first isolation signal ISO1, and the transistors N7 and N8 of the second isolation gate ISOG2 are gated to a second isolation signal ISO2.

The sense amplifier S/A includes a column select gate CSLG formed by NMOS transistors N9 and N10. The NMOS transistor N9 is connected between a true data line D and the true sub-bit line SBL. The NMOS transistor N10 is connected between a complementary data line DB and the complementary sub-bit line SBLB. Each of the NMOS transistors N9 and N10 is gated to a column select signal CSL.

The sense amplifier S/A further includes sense amplifying NMOS transistors N11 and N12, and PMOS transistors P1 and P2. The NMOS transistors N11 and N12 are connected in series between the true sub-bit line SBL and the complementary sub-bit line SBLB. Likewise, the PMOS transistors P1 and P2 are also connected in series between the true sub-bit line SBL and the complementary sub-bit line SBLB. The NMOS transistor N12 and the PMOS transistor P2 are gated to the true sub-bit line SBL, while the NMOS transistor N11 and the PMOS transistor P1 are gated to the complementary sub-bit line SBLB. Further, a first sense amplifier control signal LA is applied to the connection node between the PMOS transistors P1 and P2, and a second sense amplifier control signal LAB is applied to the connection node between the NMOS transistors N11 and N12.

An operation of the floating body transistor capacitorless memory cell device of FIGS. 3 and 4 according to an embodiment of the present invention will now be described with reference to FIGS. 5A through 5C.

Figure 5A:
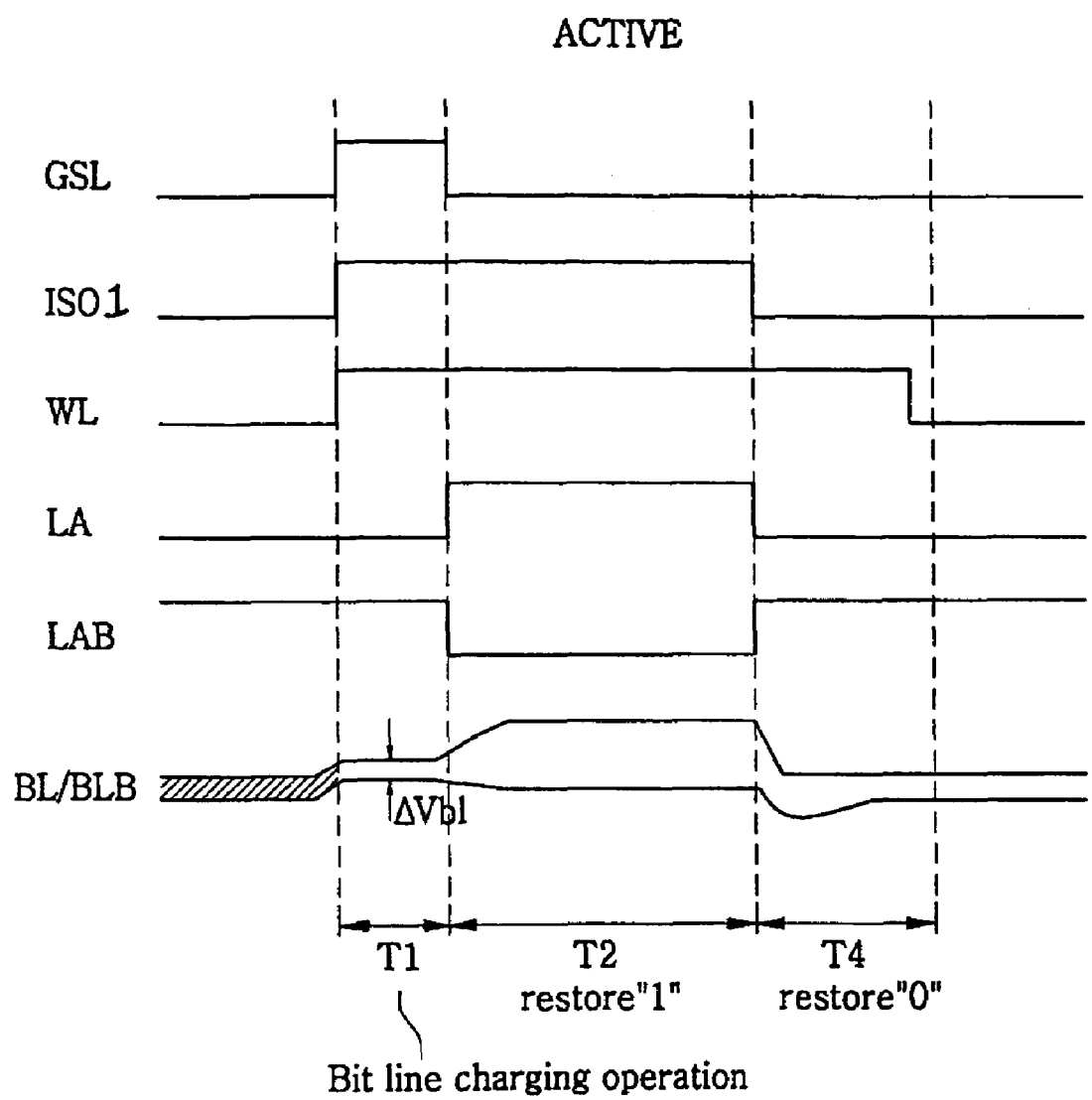
FIGS. 5A through 5C are timing diagrams for explaining the operation of a floating body transistor capacitorless memory cell device according to an embodiment of the present invention.

Referring collectively to FIGS. 3, 4 and 5A, an active operation according to an embodiment of the present invention will be described first. The active operation includes a restore function, and time intervals T1 and T2 of the active operation are executed prior to each read and write operation.

At the start of a bit line charging time interval T1, the control block 400 causes the ground select line signal GSL and the first isolation signal ISO1 to go HIGH (e.g., 2v). As such, the transmission gates TG1 (transistor N2) and TG2 (transistor N4) are turned ON, the true bit line BL is connected to the true sub-bit line SBL, and the complementary bit line BLB is connected to the complementary sub-bit line SBLB. Also, the row decoder activates the word line WL to HIGH (e.g., 2v or more), and thus the floating body transistor capacitorless memory cells FN1 and FN1B are turned on to a degree dependent upon their respective threshold voltages.

As a result of the differing threshold voltages of the floating body transistor capacitorless memory cells FN1 and FN1B, the voltage of the true bit line BL differs from that of the complementary bit line BLB. For example, assume that the memory cell FN1 is written with data "1" and the memory cell FN1B is written with data "0". In this case, the threshold voltage Vth1 of the memory cell FN1 is less than the threshold voltage Vth0 of the memory cell FN1B. As a result, assuming a 2v supply voltage (VCC=2v), the true bit line voltage VBL and the complementary bit line voltage VBLB are approximately as follows:

$$VBL = 2v - VthN2 - Vth1$$

$$VBLB = 2v - VthN4 - Vth0$$

So, as shown in FIG. 5A, the voltage difference ΔVBL between VBL and VBLB is as follows:

$$\Delta VBL = Vth0 - Vth1$$

By way of example only, ΔVBL may be on the order of about 0.3v when the supply voltage is 2v.

The time interval T2 is for restoring a data "1" into one of the floating body transistor capacitorless memory cells FN1 and FN1B. In the example given here, the data "1" is restored in the memory cell FN1.

The control block 400 causes the ground select line signal GSL to go LOW (e.g., 0v), which turns off the transmission gates TG1 (transistor N2) and TG2 (transistor N4) and places the bit lines BL/BLB in a floating state. Also, the first sense amplifier control signal LA is activated to HIGH (e.g., 2v) and the second sense amplifier control signal LAB is activated to LOW (e.g., 0v). The sense amplifier S/A thus detects the bit line voltage difference ΔVBL and, in the example given here, amplifies the true bit line BL voltage to VCC (e.g., 2v) and the complementary bit line BLB voltage to VSS (e.g., ground). During this time, the true bit line BL voltage (VCC) is applied to the memory cell FN1 so as to restore the data "1" of the memory cell FN1.

The time interval T3 is for restoring a data "0" into one of the floating body transistor capacitorless memory cells FN1 and FN1B. In the example given here, the data "0" is restored in the memory cell FN1B.

The control block 400 causes the isolation signal ISO1 to go LOW (e.g., 0v), to thereby electrically isolate the bit lines BL and BLB from the sub-bit lines SBL and SBLB, respectively. As a result, the true bit line BL voltage drops to the threshold voltage VthN1 of the transistor N1.

Also, due to the parasitic capacitance Cb1 between the true bit line BL and the complementary bit line BLB, the complementary bit line BLB voltage is initially driven to a negative voltage. That is, parasitic capacitive coupling cause a reverse bias between the floating body transistor capacitorless memory cell FN1B and the complementary bit line BLB. Thus, during this time, data "0" is restored in the floating body transistor capacitorless memory cell FN1B. Eventually, the complementary bit line BL voltage becomes the threshold voltage VthN4 of the transistor N4.

Figure 5B:
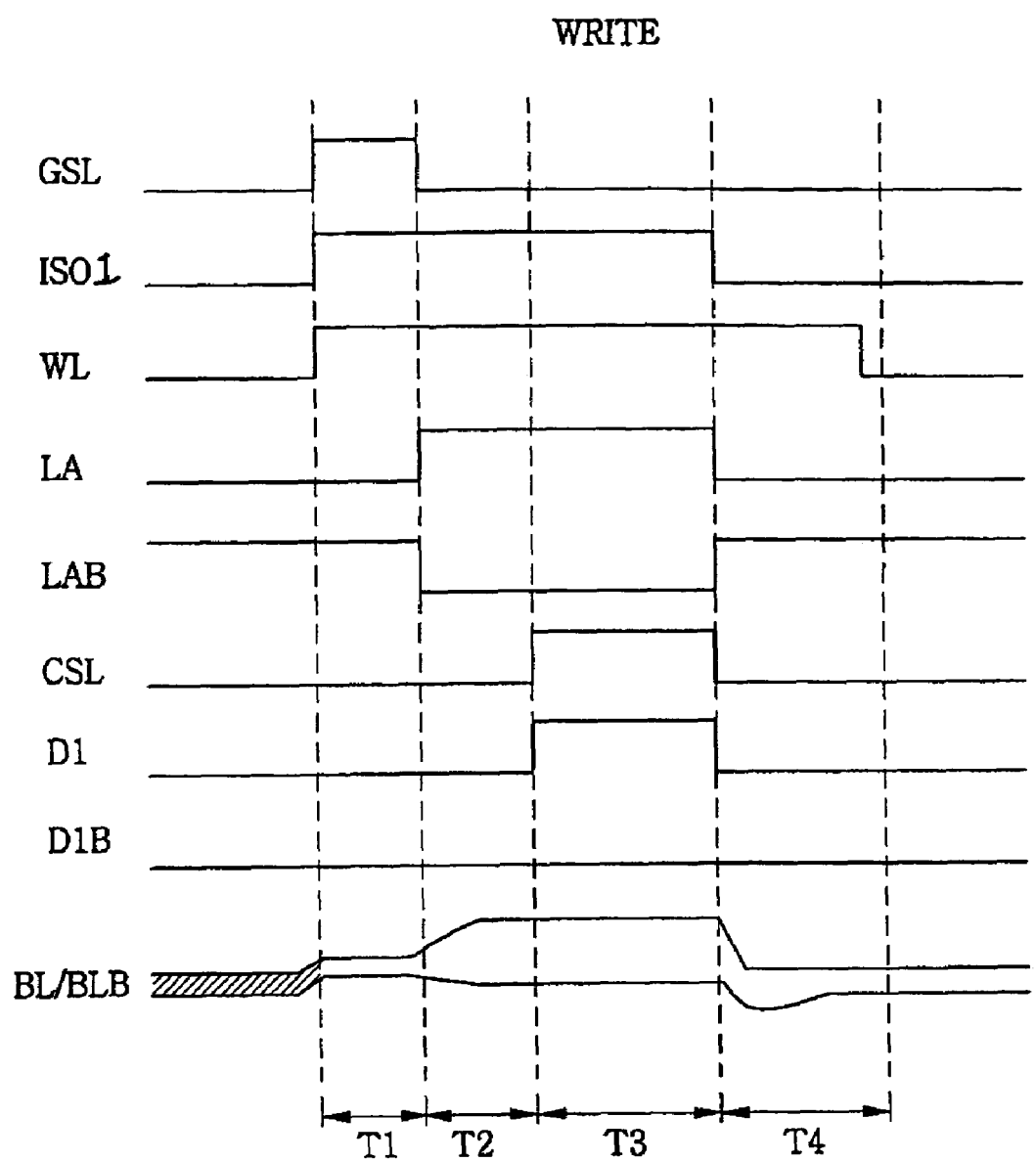

Referring collectively to FIGS. 3, 4 and 5B, a write operation according to an embodiment of the present invention will now be described. An example is presented in which data "1" is written into the floating body transistor capacitorless memory cell FN1, and data "0" is written into the floating body capacitorless memory cell FN1B.

Time intervals T1 and T2 of the write operation of FIG. 5B are the same as time intervals T1 and T2 of the active operation described above in connection with FIG. 5A. Accordingly, a detailed description thereof is omitted here to avoid redundancy.

At time interval T3, the column decoder 300 is responsive to a write command and column address to activate to HIGH (e.g., 2v) the column select line signal CSL. This causes the column select gate CSLG to electrically connect the true data line D to the true sub-bit line SBL, and to electrically connect the complementary data line DB to the complementary sub-bit line SBLB. As such, since the isolation signal ISO1 is activated to HIGH, data "1" of the true data line D and data "0" of the complementary data line DB are respectively transmitted to the true bit line BL and the complementary bit line BLB. Therefore, in this example, the true bit line BL voltage becomes about VCC (e.g., 2v), which causes the data "1" to be written into the floating body transistor capacitorless memory cell FN1.

At time interval T4, the column decoder 300 deactivates the column select line signal CSL to LOW, and the control block 400 deactivates the isolation signal ISO to LOW, and the sense amplifier control signals LA and LAB to LOW and HIGH, respectively. As with the restore "0" (T3) of previously described FIG. 5A, the parasitic capacitance Cb1 between the true bit line BL and the complementary bit line BLB causes the complementary bit line BLB voltage to initially be driven to a negative voltage. The parasitic capacitive coupling causes a reverse bias between the floating body transistor capacitorless memory cell FN1B and the complementary bit line BLB. Thus, during time interval T4, data "0" is written in the floating body transistor capacitorless memory cell FN1B.

Figure 5C:
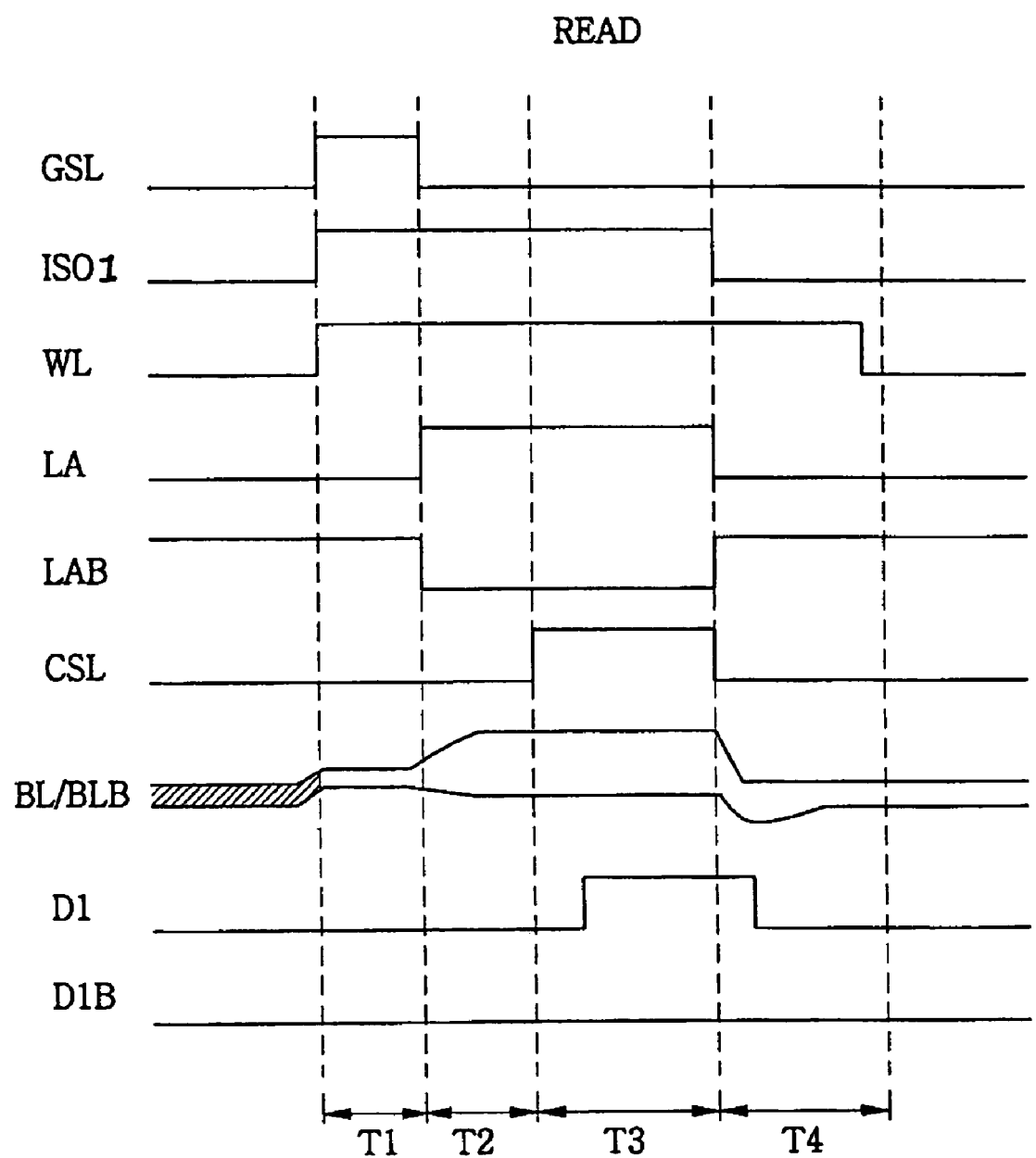

Referring collectively to FIGS. 3, 4 and 5C, a read operation according to an embodiment of the present invention will now be described. As before, an example is presented in which data "1" is read from the floating body transistor capacitorless memory cell FN1, and data "0" is read from the floating body capacitorless memory cell FN1B.

Time intervals T1 and T2 of the read operation of FIG. 5C are the same as time intervals T1 and T2 of the active operation described above in connection with FIG. 5A. Accordingly, a detailed description thereof is omitted here to avoid redundancy.

At time interval T3, the column decoder 300 is responsive to a read command and address to activate the column select line signal CSL to HIGH. As such, data "1" on the true sub-bit line SBL is transmitted to the true data line D, and data "0" on the complementary sub-bit line SBLB is transmitted to the complementary data line DB.

Thereafter, time interval T4 is executed in the same manner as described previously in connection with time interval T3 of FIG. 5A, thereby restoring the data "0" of the floating body transistor capacitorless memory cell FN1B.

The memory device and operational methods described above offer a number of advantages over the conventional floating body transistor capacitor memory devices. For example, by applying a sufficiently high voltage as the ground select line signal GSL, the bit line voltage differential ΔVBL can be generated to allow for the use of a voltage sense amplifier, rather then the conventional and complex current sense amplifier. Further, it is not necessary to equalize the bit lines BL and BLB after the active operation since ΔVBL is established during the bit line charging operation. Still further, the circuit configuration is simplified by utilizing parasitic capacitive coupling between the bit lines BL and BLB to achieve a negative bias condition which restores and/or writes data "0" into the floating body transistor capacitorless memory cell.

Further, the embodiment utilizes complementary floating body transistor capacitorless memory cells to define each unit memory cell of a memory device, such as a DRAM device. As such, the embodiment offers the advantage of a high density capacitorless memory cell structure, while at the same time avoiding the need for reference (or dummy cells), reference current generators, and other conventional circuitry needed to read the logic values of the transistor cells. Also, by avoiding the provision of reference cells, processing time is not expended in refreshing the reference cells.

In the embodiment described above, the capacitance Cb1 is a parasitic capacitance between the conductive true bit line BL and the conductive complementary bit line BLB. As one skilled in the art will appreciate, these conductive lines are separated by one or more insulators, thus forming parasitic capacitance. It is noted, however, that an actual capacitive device can be electrically inserted between the bit lines BL and BLB to replace or supplement the parasitic capacitance Cb1.

An operation of the floating body transistor capacitorless memory cell device of FIGS. 3 and 4 according to another embodiment of the present invention will now be described with reference to FIGS. 6A through 6C.

Figure 6B:
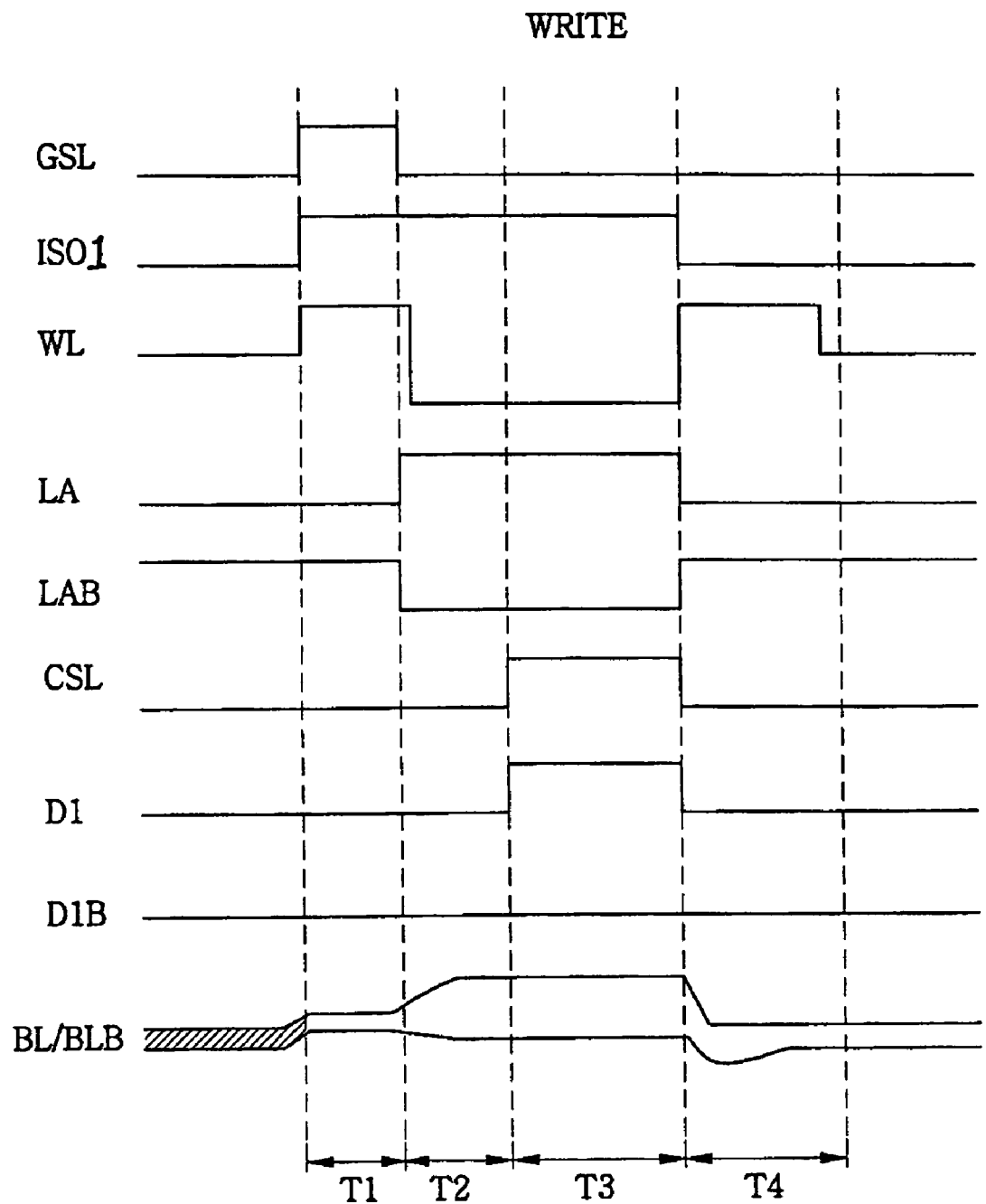
Figure 6C:
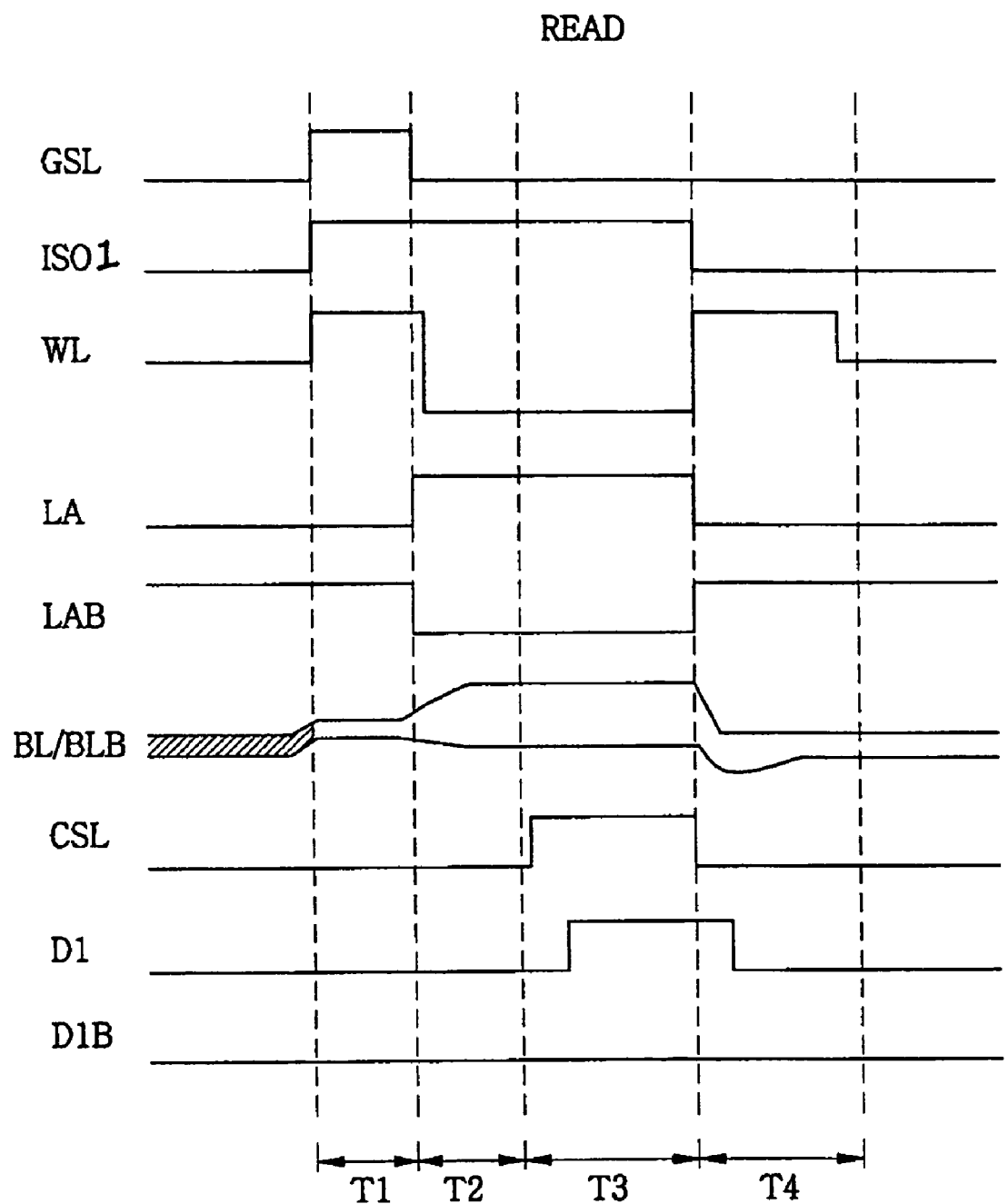

The embodiment of FIGS. 6A through 6C is the same as the embodiment of FIGS. 5A through 5C, except that gate induced drain leakage (GIDL) current is utilized (instead of impact ionization) to write and/or restore data "1" in the floating body transistor capacitorless memory cell FN1. That is, by driving the word line WL voltage to a negative voltage (e.g., −0.6v), the gate-of the memory cell FN1 becomes negative while the drain voltage of the memory cell FN1 is positive. As one skilled in the art will understand, this condition can cause GIDL current to occur in the memory cell FN1 which writes or restores "1" data in the memory cell FN1.

Referring to FIG. 6A, the word line WL voltage is driven to a negative voltage during time interval T2 to establish a GIDL current which restores data "1" in the memory cell FN1. Thereafter, the word line WL voltage goes HIGH at time interval T3 to restore data "0" in memory cell FN1B as described previously in connection with FIG. 5A.

Likewise, in the write operation of FIG. 6B and the read operation of FIG. 6C, the word line WL voltage is driven to a negative voltage during time intervals T2 and T3 to establish a GIDL current which restores and/or writes data "1" in the memory cell FN1. Thereafter, the word line WL voltage goes HIGH at time interval T4 to restore data "0" in memory cell FN1B as described previously in connection with FIGS. 5B and 5C.

Except as noted above, the embodiment of FIGS. 6A through 6C is the same as the embodiment of previously described FIGS. 5A through 5C. Accordingly, a more detailed discussion of FIGS. 6A through 6C is omitted here to avoid redundancy.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor memory device comprising:
   complementary first and second bit lines;
   a unit memory cell including complementary first and second floating body transistor capacitorless memory cells respectively coupled to the complementary first and second bit lines; and
   a voltage sense amplifier connected between the complementary first and second bit lines which amplifies a voltage differential between the complementary first and second bit lines.

2. The semiconductor memory device of claim 1, wherein the sense amplifier comprises:
   first and second NMOS transistors connected in series between the complementary first and second bit lines; and
   first and second PMOS transistors connected in series between the complementary first and second bit lines;
   wherein respective gates of the first NMOS and PMOS transistors are connected to the first bit line, and respective gates of the second NMOS and PMOS transistors are connected to the second bit line.

3. The semiconductor memory device of claim 1, wherein the memory device includes capacitive coupling between the first and second bit lines which causes a negative basis to write or restore a threshold voltage of one of the first and second floating body transistor capacitorless memory cells.

4. The semiconductor memory device of claim 3, wherein the capacitive coupling includes a parasitic capacitance between the first and second bit lines.

5. The semiconductor memory device of claim 3, wherein the capacitive coupling includes a capacitive device connected between the first and second bit lines.

6. The semiconductor memory device of claim 1, further comprising an isolation gate connected between the voltage sense amplifier and the first and second bit lines.

7. The semiconductor memory device of claim 6, wherein the sense amplifier includes complementary first and second sub-bit lines, and a column select gate which selectively connects the first and second sub-bit lines to complementary first and second data lines, respectively.

8. The semiconductor memory device of claim 1, wherein the first and second floating body transistor capacitorless memory cells are gated to a word line.

9. The semiconductor memory device of claim 8 further comprising a ground select line and first and second transmission gates, wherein the first transmission gate and the first floating body transistor capacitorless memory cell are connected in series between the ground select line and the first bit line, and the second transmission gate and the second floating body transistor capacitorless memory cell are connected in series between the ground select line and the second bit line.

10. The semiconductor device of claim 9, wherein the first transmission gate includes a first transistor gated to the first bit line and a second transistor gated to the ground select line, and wherein the second transmission gate includes a third transistor gated to the second bit line and a fourth transistor gated to the ground select line.

11. A semiconductor memory device, comprising a memory cell array which includes a plurality memory cell blocks and a plurality of voltage sense amplifiers connected to the plurality of memory cell blocks,
   wherein each of the memory cell blocks includes complementary first and second bit lines, and a unit memory cell including complementary first and second floating body transistor capacitorless memory cells respectively connected to the complementary first and second bit lines.

12. The semiconductor memory device of claim 11, wherein the complementary first and second floating body transistor capacitorless memory cells are gated to word lines within each memory cell block.

13. The semiconductor memory device of claim 12, further comprising a row decoder connected to the word lines within each memory cell block.

14. The semiconductor memory device of claim 13, further comprising a column decoder which selectively connects complementary first and second data lines to the first and second bit lines, respectively.

15. The semiconductor memory device of claim 14, further comprising a control block which controls an operation of the plurality of sense amplifiers.

16. The semiconductor memory device of claim 11, wherein the memory device includes capacitive coupling between the first and second bit lines which causes a negative basis to write or restore a threshold voltage of one of the first and second floating body transistor capacitorless memory cells.

17. The semiconductor memory device of claim 16, wherein the capacitive coupling includes a parasitic capacitance between the first and second bit lines.

18. The semiconductor memory device of claim 16, wherein the capacitive coupling includes a capacitive device connected between the first and second bit lines.

19. The semiconductor memory device of claim 11, wherein each sense amplifier includes complementary first and second sub-bit lines, and a column select gate which selectively connects the first and second sub-bit lines to complementary first and second data lines, respectively.

20. A method of writing or restoring a threshold voltage of a floating body transistor capacitorless memory cell device, said method comprising capacitively coupling first and second bit lines to cause a negative basis condition which writes or restores a threshold voltage of one of first and second floating body transistor capacitorless memory cells respectively connected to the first and second bit lines.

21. The method of claim 20, wherein the threshold voltage of the one of the first and second floating body transistor capacitorless memory cells is a relatively high threshold voltage, and wherein a threshold voltage of the other of the first and second floating body transistor capacitorless memory cells is a relatively low threshold voltage.

22. The method of claim 21, wherein the relatively low threshold voltage of the other of the first and second floating body transistor capacitorless memory cells is written or restored before the relatively high threshold voltage of the one of the first and second floating body transistor capacitorless memory cells is written or restored.

23. The method of claim 22, wherein the impact ionization is utilized to write or restore the relatively low threshold voltage of the other of the first and second floating body transistor capacitorless memory cells.

24. The method of claim 22, wherein the gate induced drain leakage current (GIDL) is utilized to write or restore the relatively low threshold voltage of the other of the first and second floating body transistor capacitorless memory cells.

25. A method of operating a semiconductor memory device, comprising:
restoring a low threshold state of a complementary first floating body transistor capacitorless memory cell connected to the first bit line; and
restoring a high threshold state of a complementary second floating body transistor capacitorless memory cell connected to the second bit line;
wherein the high threshold state of the complementary second floating body transistor capacitorless memory cell is restored by capacitive coupling between the first and second bit lines which causes a voltage of the second bit line to become negative.

26. The method of claim 25, wherein impact ionization is utilized to restore the low threshold state of the second floating body transistor capacitorless memory cell.

27. The method of claim 26, wherein a positive voltage is applied to the gate of the second floating body transistor capacitorless memory cell when restoring the low threshold state of the second floating body transistor capacitorless memory cell.

28. The method of claim 25, wherein gate induced drain leakage (GIDL) current is utilized to restore the low threshold state of the second floating body transistor capacitorless memory cell.

29. The method of claim 26, wherein a negative voltage is applied to the gate of the second floating body transistor capacitorless memory cell when restoring the low threshold state of the second floating body transistor capacitorless memory cell.

30. A method of operating a semiconductor memory device, comprising:
charging complementary first and second bit lines which are respectively connected to complementary first and second floating body transistor capacitorless memory cells, wherein a voltage differential between the charged first and second bit lines corresponds to difference in threshold voltages between the first and second floating body transistor capacitorless memory cells; and
amplifying the voltage differential between the charged first and second bit lines.

31. The method of claim 30, further comprising reading the amplified voltage differential between the charged first and second bit lines.

32. The method of claim 30, further comprising using the amplified voltage differential to restore a low threshold state of one of the first and second floating body transistor capacitorless memory cells.

33. The method of claim 32, further comprising applying a positive voltage to gates of the first and second floating body transistor capacitorless memory cells when restoring the low threshold state of the one of the first and second floating body transistor capacitorless memory cells.

34. The method of claim 32, further comprising applying a negative voltage to gates of the first and second floating body transistor capacitorless memory cells when restoring the low threshold state of the one of the first and second floating body transistor capacitorless memory cells.

35. The method of claim 32, further comprising restoring a high threshold state of the other of the first and second floating body transistor capacitorless memory cells by capacitive coupling between the first and second bit lines which negatively biases the other of the first and second floating body transistor capacitorless memory cells.

* * * * *

UNITED STATES PATENT AND TRADEMARK OFFICE
CERTIFICATE OF CORRECTION

| | | |
|---|---|---|
| PATENT NO. | : 7,433,223 B2 | Page 1 of 1 |
| APPLICATION NO. | : 11/546421 | |
| DATED | : July 12, 2007 | |
| INVENTOR(S) | : Jin-Young Kim | |

It is certified that error appears in the above-identified patent and that said Letters Patent is hereby corrected as shown below:

On the Cover Page, add the following:

item (30)   Foreign Application Priority Data

Jan. 6, 2006   (KR) .............. 10-2006-0001989

Signed and Sealed this

Twenty-ninth Day of June, 2010

David J. Kappos
*Director of the United States Patent and Trademark Office*